(12) United States Patent
Uno et al.

(10) Patent No.: US 8,105,871 B2
(45) Date of Patent: Jan. 31, 2012

(54) SEMICONDUCTOR DEVICE AND MANUFACTURING METHOD OF THE SAME

(75) Inventors: Tadashi Uno, Kawasaki (JP); Nobukatsu Saito, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/643,895

(22) Filed: Dec. 22, 2006

(65) Prior Publication Data

US 2008/0042254 A1 Feb. 21, 2008

(30) Foreign Application Priority Data

Aug. 16, 2006 (JP) ................................. 2006-221953

(51) Int. Cl.
*H01L 21/00* (2006.01)

(52) U.S. Cl. .............. 438/106; 438/51; 438/55; 438/64; 438/612; 438/125; 438/26; 257/678; 257/778; 257/E21.511

(58) Field of Classification Search .................... 438/106
See application file for complete search history.

(56) References Cited

U.S. PATENT DOCUMENTS

| | | | | |
|---|---|---|---|---|
| 5,268,255 A | * | 12/1993 | Kikuchi et al. | ............ 430/280.1 |
| 5,859,471 A | * | 1/1999 | Kuraishi et al. | ............... 257/666 |
| 5,973,337 A | * | 10/1999 | Knapp et al. | ................... 257/99 |
| 6,337,510 B1 | * | 1/2002 | Chun-Jen et al. | ............. 257/666 |
| 6,340,837 B1 | * | 1/2002 | Miyaki et al. | ................. 257/666 |
| 6,570,259 B2 | | 5/2003 | Alcoe | |
| 2003/0006499 A1 | * | 1/2003 | Choi | .............................. 257/700 |
| 2003/0020146 A1 | * | 1/2003 | Yee et al. | ...................... 257/666 |
| 2005/0016289 A1 | * | 1/2005 | Saito et al. | ....................... 73/754 |
| 2005/0093439 A1 | * | 5/2005 | Harada et al. | .................. 313/506 |
| 2005/0110156 A1 | | 5/2005 | Geyer | |

FOREIGN PATENT DOCUMENTS

| | | |
|---|---|---|
| CN | 1246729 | 3/2000 |
| JP | 2000-114427 A | 4/2000 |
| JP | 3534501 B2 | 6/2004 |
| JP | 3565204 B2 | 9/2004 |
| JP | 2006-024657 A | 1/2006 |
| TW | 200522305 | 7/2005 |

OTHER PUBLICATIONS

Korean Office Action dated Dec. 24, 2007 (mailing date), issued in corresponding Application No. 10-2007-0002874.
"Chinese Office Action", English translation, of corresponding Chinese Patent Application No. 200710001688.5, dated Oct. 10, 2008.
Office Action mailed by the Chinese Intellectual Property Office on Mar. 27. 2009 in connection with corresponding Patent Application Serial No. 200710001688.5.
Taiwanese Office Action mailed Sep. 15, 2009 issued with respect to Taiwanese Patent Application No. 95148441, (English-language Translation Provided).

* cited by examiner

*Primary Examiner* — Charles Garber
*Assistant Examiner* — Pape Sene
(74) *Attorney, Agent, or Firm* — Fujitsu Patent Center

(57) ABSTRACT

A semiconductor device includes a semiconductor element provided over a wiring board; sealing resin configured to seal the semiconductor element; and reinforcing resin provided at least at a part of a boundary part of the sealing resin and the wiring board. In the above-mentioned semiconductor device, the reinforcing resin may be provided along a perimeter of the boundary part of the sealing resin and the wiring board. The reinforcing resin may be provided at a boundary part of the sealing resin and the wiring board in a vicinity of a corner part of the sealing resin.

13 Claims, 10 Drawing Sheets

SEMICONDUCTOR DEVICE AND MANUFACTURING METHOD OF THE SAME

BACKGROUND OF THE INVENTION

1. Field of the Invention

The present invention generally relates to semiconductor devices and manufacturing methods of the same, and more specifically, to a semiconductor device having a PBGA (Plastic Ball Grid Array) package structure and a manufacturing method of the semiconductor device.

2. Description of the Related Art

As today's electronic apparatuses have miniaturized sizes, high functionalities or high densities, it is required that electronic parts such as semiconductor devices applied to the electronic apparatuses also have miniaturized sizes or be thin. Because of this, as a package proper for high density mounting wherein a mounting area is reduced by miniaturization, a surface mount technology type package such as a PBGA (Plastic Ball Grid Array) has been suggested.

FIG. 1 is a view showing a structure of a related art semiconductor device having the PBGA (Plastic Ball Grid Array) package. More specifically, FIG. 1(b) is a cross-sectional view taken along line X-X' of FIG. 1(a).

Referring to FIG. 1, a related art semiconductor device 10 having the PBGA package has a structure where a semiconductor device 2 is mounted on a wiring board 1 via a die bonding member not shown in FIG. 1, such as a die bonding film.

The semiconductor element 2 is connected to the wiring board 1 by bonding wires 3 made of gold (Au) or the like.

A basic material of the wiring board 1 is insulation resin such as glass-epoxy resin. On an upper surface of the wiring board 1, a conductive layer 4A made of copper (Cu) or the like is selectively provided. The conductive layer 4A other than areas where the bonding wires 3 are connected is selectively covered with a resist layer 5A.

In addition, on a lower surface of the wiring board 1, a conductive layer 4B made of copper (Cu) or the like is selectively provided. The conductive layer 4B is selectively covered with a resist layer 5B. Plural outside connection terminals (bumps) 6 such as spherical shape electrode terminals whose main ingredient is solder are arranged in a grid state on the conductive layer 6B defined by the resist layer 5B. The conductive layer 4B is connected to the conductive layer 4A.

The semiconductor element 2 and the bonding wire 3 are sealed by sealing resin 7 such as epoxy group resin.

However, the sealing resin 7 is not provided in the vicinities of both end parts of the wiring board 1. Therefore, the wiring board 1 projects to outside of the sealing resin 7.

A wiring pattern 9 formed on an upper surface of the wiring board 1 shown in FIG. 1(a) is made of copper (Cu). Nickel gold (Ni—Au) plating is applied on a surface of the wiring pattern 9. The wiring pattern 9 functions as a flow path of the molten sealing resin 7 when the sealing resin 7 is provided on the wiring board 1 by using a mold based on a transfer molding method. Since adhesion of the Nickel gold (Ni—Au) plating to the sealing resin 7 is not good, it is possible to easily remove a runner.

Equipment used for manufacturing a related art lead frame type package can be applied to manufacturing the semiconductor device 10 having such a PBGA package structure. This is discussed with reference to FIG. 2.

Here, FIG. 2 is a plan view showing a relationship between the related art semiconductor device 10 having the PBGA package structure shown in FIG. 1 and a related art lead frame type semiconductor device. The related art semiconductor device 10 having the PBGA package structure shown in FIG. 1 is shown at the right side of FIG. 2, and the related art lead frame type semiconductor device 20 is shown at the left side of FIG. 2.

In the lead frame type semiconductor device 20, a semiconductor element provided on a die pad is connected to inner leads by bonding wires. The inner leads, the semiconductor element provided on the die pad, and the bonding wires are sealed by sealing resin 21. Outer leads 22 are extended from the inner leads to outside of the sealing resin 21.

As shown by the dotted areas in FIG. 2, configuration or package size of the semiconductor device 10 having the PBGA package structure shown in FIG. 1, namely configuration or size of the sealing resin 7, is substantially the same as configuration or package size of the lead frame type semiconductor device 20, namely configuration or size of the sealing resin 21.

Accordingly, the equipment used for manufacturing the related art lead frame type semiconductor device 20 can be applied to manufacturing the semiconductor device 10 having the PBGA package structure, so that a limitation of having a large number of pins in the lead frame type semiconductor device 20 can be solved.

Japanese Patent No. 3534501 discloses a semiconductor device provided by arranging a semiconductor pellet on a top plane of a substrate with plural connecting terminals. In this semiconductor device, a group of the connecting terminals is arranged in plural annular lines at the periphery of the semiconductor pellet. A space with a low height formed between the semiconductor pellet and the substrate by the connecting terminal group is filled with resin so that a reinforcing resin layer is formed.

In addition, Japanese Patent No. 3565204 discloses an electronic apparatus having the following structure. The electronic apparatus comprises an element mounting substrate having an electrode formed on the rear side of an element mounting surface, a wiring board which is arranged so as to face the element mounting substrate across a prescribed interval and which has an electrode formed at a position facing the electrode of the element mounting substrate, a meltable member for joining the electrode of the element mounting substrate with the electrode of the wiring board, and a resin reinforcing member which is arranged outboard of the meltable member for joining the end of the element mounting substrate with the site of a wiring substrate facing this end.

However, the semiconductor device 10 having the PBGA package structure shown in FIG. 1 has a problem shown in FIG. 3. Here, FIG. 3 is an enlarged view of a part surrounded by a dotted line in FIG. 1.

As discussed above, the configuration or package size of the semiconductor device 10 having the PBGA package structure shown in FIG. 1, namely the configuration or size of the sealing resin 7, is substantially the same as the configuration or size of the package of the lead frame type semiconductor device 20, namely the configuration or size of the sealing resin 21. In addition, as discussed with reference to FIG. 1, the sealing resin 7 is not provided in the vicinities of both end parts of the wiring board 1. Only the wiring board 1 projects to the outside of the sealing resin 7.

However, coefficients of thermal expansion of members forming the semiconductor device 10 shown in FIG. 1 are different from each other. For example, the coefficient of thermal expansion of silicon (Si) used as the semiconductor element 2 is $3 \times 10^{-6}/°C$., the coefficient of thermal expansion of the sealing resin 7 is $8 \times 10^{-6}/°C$., and the coefficient of thermal expansion of the wiring board 1 is $16 \times 10^{-6}/°C$.

In addition, for example, the temperature inside of a reflow hearth in a reflow process for mounting a package on the wiring board 1 reaches around 260° C. Heat is applied as a reliability test of the semiconductor device 10. Furthermore, in normal use of the semiconductor device 10, the semiconductor device 10 may be put under atmospheric conditions wherein the temperature in summer may be higher than 80° C.

Accordingly, under the atmospheric conditions wherein such a temperature change occurs, the members may expand or contract, due to the difference of the coefficients of thermal expansion of the members, concentration of stress may be generated at a boundary part of an end part of the sealing resin 7 and the wiring board 1.

In addition, in a process of manufacturing the semiconductor device 10, for example, bending when the external configuration is formed by using a dicing blade or the like or concentration of mechanical stress due to a fall of the semiconductor device 10 or the like may be generated at the boundary part of an end part of the sealing resin 7 and the wiring board 1.

Due to such concentration of stress, as shown in FIG. 3, a crack (indicated by "X" in FIG. 3) is generated in the wiring board 1 so that bad conductivity, namely pattern breakage, of the conductive layer 4 of the wiring board 1 is caused. As a result of this, an electric property of the semiconductor device may be degraded.

SUMMARY OF THE INVENTION

Accordingly, embodiments of the present invention may provide a novel and useful semiconductor device and manufacturing method of the same solving one or more of the problems discussed above.

More specifically, the embodiments of the present invention may provide a semiconductor device whereby stress that may be generated at a boundary part of an end part of sealing resin and a wiring board is dispersed so that generation of a crack in the wiring board can be prevented, and a manufacturing method of the same.

One aspect of the present invention may be to provide a semiconductor device, including a semiconductor element provided over a wiring board; sealing resin configured to seal the semiconductor element; and reinforcing resin provided at least at a part of a boundary part of the sealing resin and the wiring board.

In the semiconductor device, the reinforcing resin may be provided along a perimeter of the boundary part of the sealing resin and the wiring board. The reinforcing resin may be provided at a boundary part of the sealing resin and the wiring board in a vicinity of a corner part of the sealing resin. The reinforcing resin may be provided at a boundary part of the sealing resin and the wiring board at a corner part of the sealing resin. The reinforcing resin may be made of a material the same as the material of the sealing resin.

Other aspect of the present invention may be to provide a manufacturing method of a semiconductor device having a structure where a semiconductor element provided over a wiring board is sealed by sealing resin, including a step of providing reinforcing resin made of a material the same as the material of the sealing resin at least a part of a boundary part of the sealing resin and the wiring board in a lump with the sealing resin when the semiconductor element is sealed.

Other aspect of the present invention may be to provide a manufacturing method of a semiconductor device having a structure where a semiconductor element provided over a wiring board is sealed by sealing resin, including a step of providing reinforcing resin made of a material different from a material of the sealing resin at least a part of a boundary part of the sealing resin and the wiring board, after the sealing resin is provided over the wiring board and is made solid.

According to the embodiment of the present invention, it is possible to provide a semiconductor device whereby stress that may be generated at a boundary part of an end part of sealing resin and a wiring board is dispersed so that generation of a crack in the wiring board can be prevented, and a manufacturing method of the same.

Other objects, features, and advantages of the present invention will be come more apparent from the following detailed description when read in conjunction with the accompanying drawings.

DETAILED DESCRIPTION OF THE PREFERED EMBODIMENTS

A description is given below, with reference to the FIG. 4 through FIG. 10 of embodiments of the present invention.

For the convenience of explanation, first, embodiments of a semiconductor device of the present invention are discussed and then an embodiment of a manufacturing method of the semiconductor device is discussed.

[Semiconductor Device]

1. A Semiconductor Device of a First Example of the Present Invention

Figure 1:
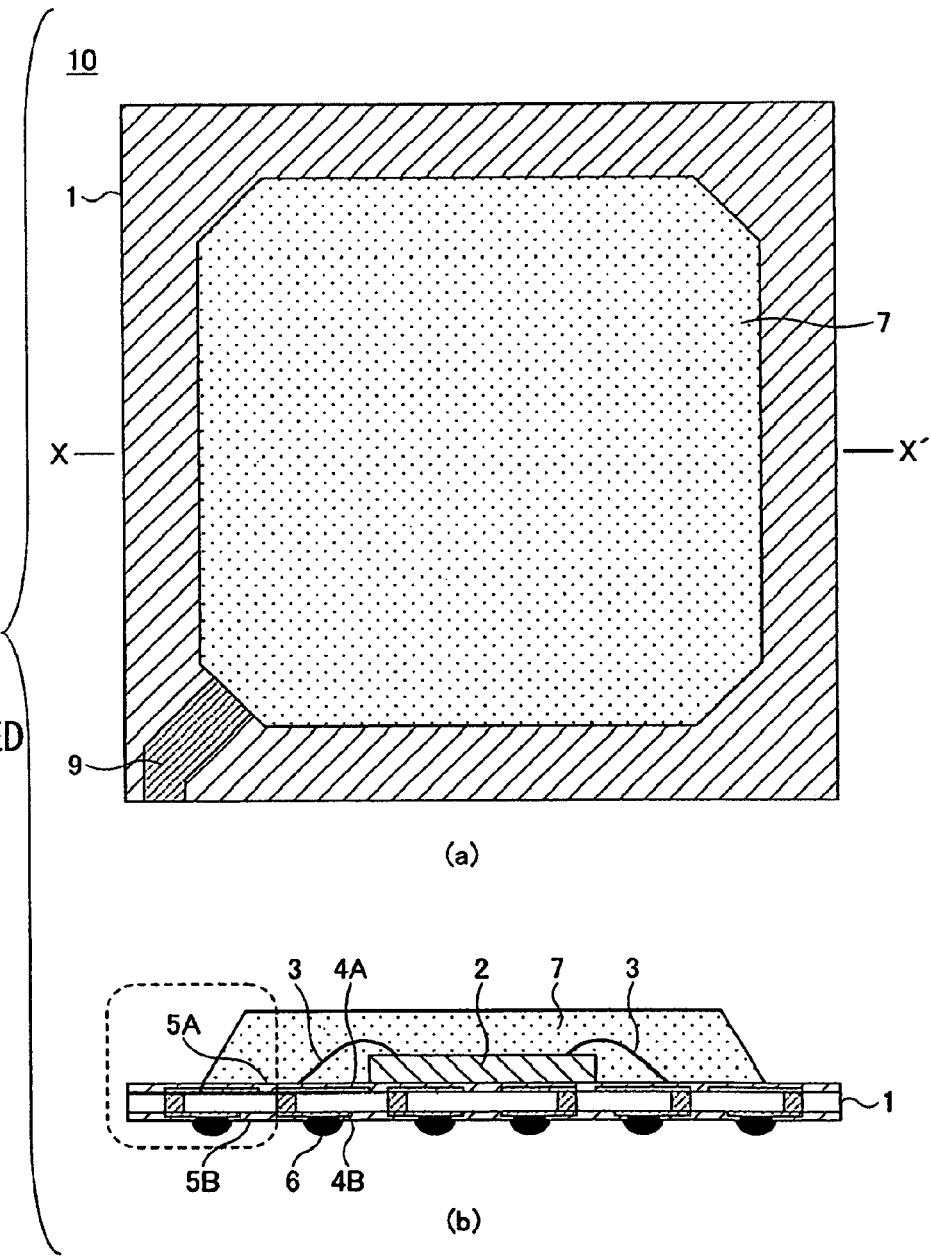
FIG. 1 is a view showing a structure of a related art semiconductor device having a PBGA (Plastic Ball Grid Array) package structure.
Figure 2:
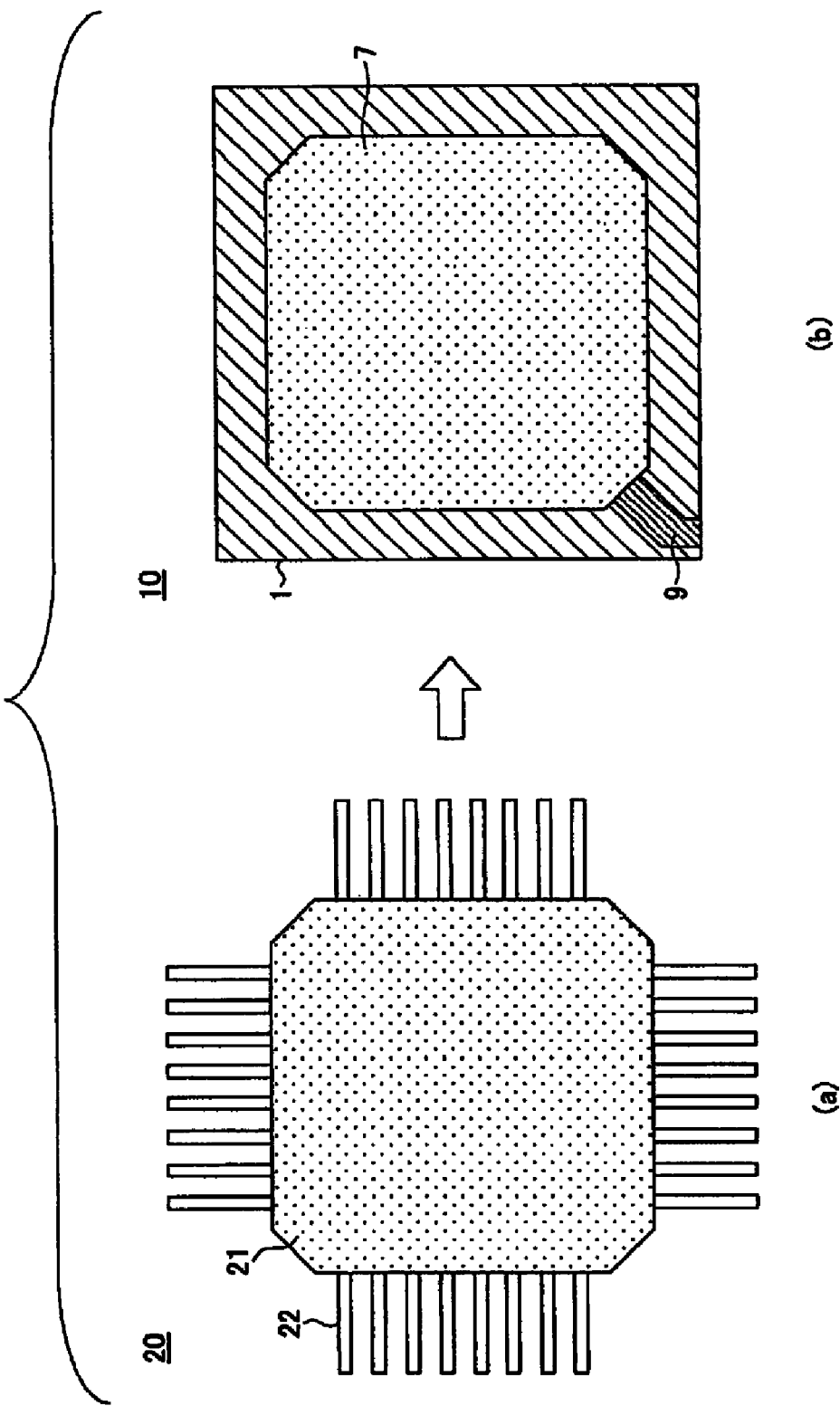
FIG. 2 is a plan view showing a relationship between the related art semiconductor device having the PBGA package structure shown in FIG. 1 and a related art lead frame type semiconductor device.
Figure 3:
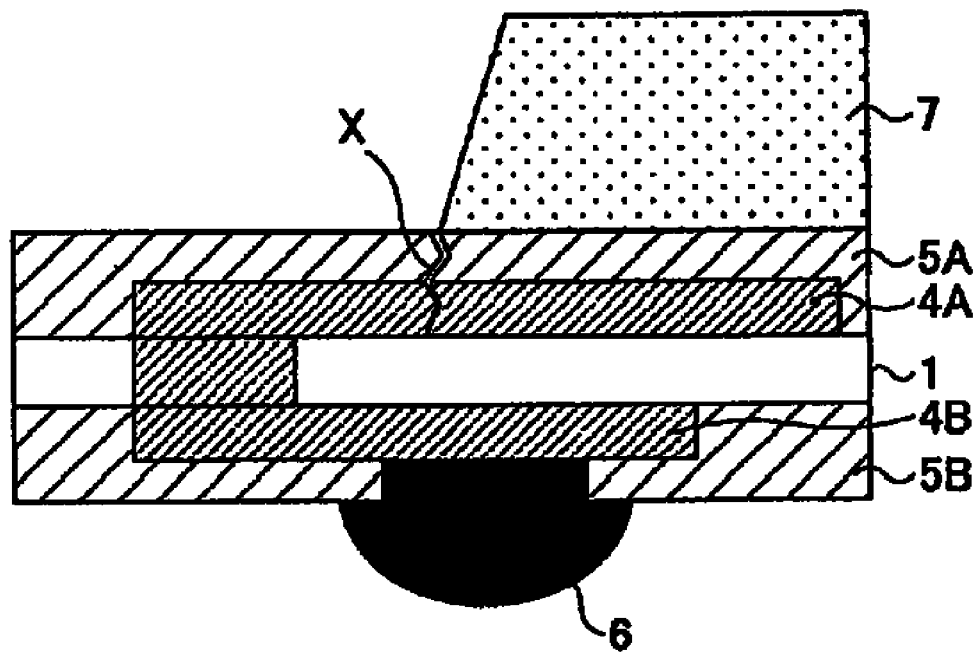
FIG. 3 is an enlarged view of a part surrounded by a dotted line in FIG. 1.
Figure 4:
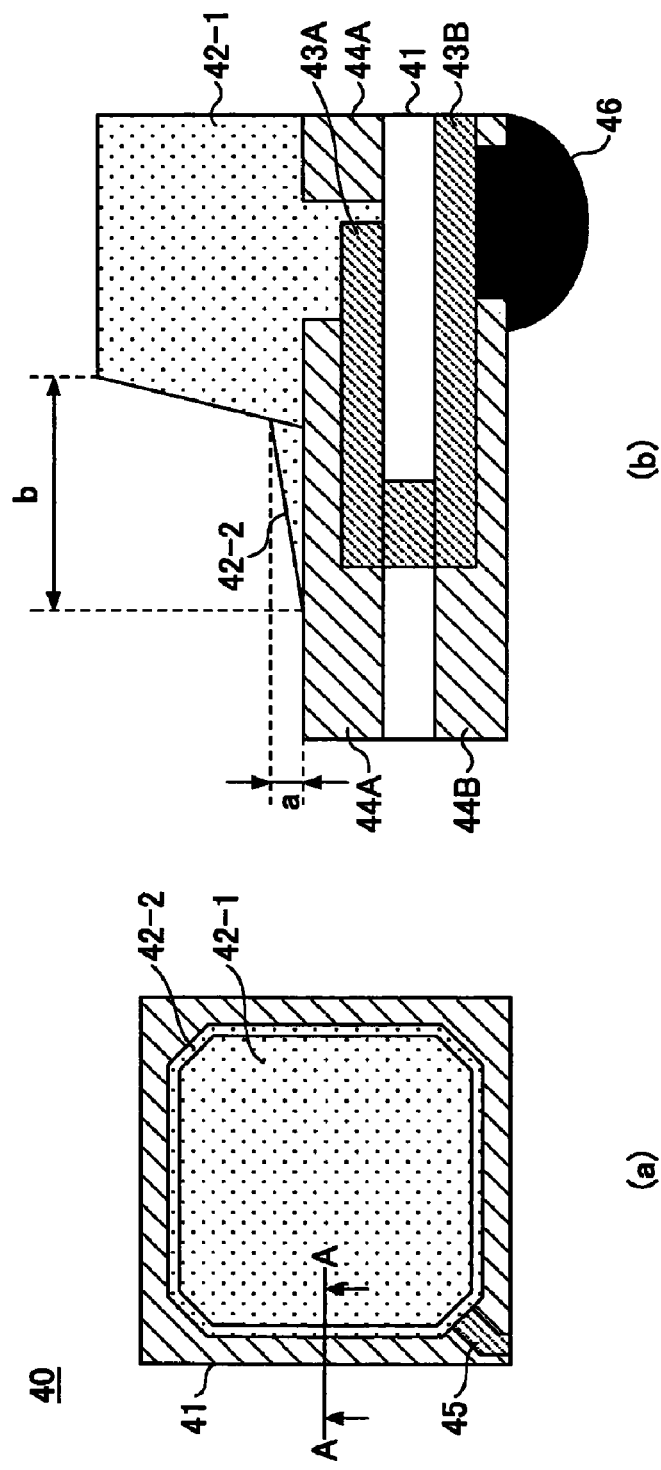
FIG. 4 is a view showing a structure of a semiconductor device of a first example of the present invention.

FIG. 4 is a view showing a structure of a semiconductor device of a first example of the present invention. More specifically, FIG. 4(*a*) is a plan view and FIG. 4(*b*) is a view taken along a line A-A in FIG. 4(*a*) and seen in a direction indicated by arrows.

Referring to FIG. 4, a semiconductor device 40 having a PBGA (Plastic Ball Grid Array) package has a structure where sealing resin 42-1 is provided on a wiring board 41.

Inside the sealing resin 42-1, a semiconductor device (not shown in FIG. 4) is mounted on the wiring board 41 via a die bonding member such as a die bonding film. The semiconductor element is connected to the wiring board 41 by bonding wires (not shown in FIG. 4) made of gold (Au) or the like.

A basic material of the wiring board 41 is insulation resin such as glass-epoxy resin. On an upper surface of the wiring board 41, a conductive layer 43A made of copper (Cu) or the like is selectively provided. The conductive layer 43A is selectively covered with a resist layer 44A.

A wiring pattern 45 formed on an upper surface of the wiring board 41 shown in FIG. 4(a) is made of copper (Cu). Nickel gold (Ni—Au) plating is applied on a surface of the wiring pattern 45. The wiring pattern 45 functions as a flow path of the molten sealing resin 42-1 when the sealing resin 42-1 is provided on the wiring board 41 by using a mold based on a transfer molding method. Since adhesion of the Nickel gold (Ni—Au) plating to the sealing resin 42-1 is not good, it is possible to easily remove a runner.

In addition, on a lower surface of the wiring board 41, a conductive layer 43B made of copper (Cu) or the like is selectively provided. The conductive layer 43B is selectively covered with a resist layer 44B. Plural outside connection terminals (bumps) 46 such as spherical shape electrode terminals whose main ingredient is solder are arranged in a grid state on the conductive layer 43B defined by the resist layer 44B. The conductive layer 43B is connected to the conductive layer 43A.

Meanwhile, reinforcing resin 42-2 is provided along a perimeter of the circumference of the sealing resin 42-1.

More specifically, the reinforcing resin 42-2 is provided along the perimeter of a boundary part of the wiring board 41 and the sealing resin 42-1 so that the boundary part is reinforced. Furthermore, the reinforcing resin 42-2 has a triangle shaped cross section.

The thickness a (length in a vertical direction) of the reinforcing resin 42-2 and a length b in a horizontal direction of the reinforcing resin 42-2 can be several tens μm.

In the first example, a material of the sealing resin 42-1 is the same as that of the reinforcing resin 42-2. Therefore, a configuration corresponding to an external configuration of the reinforcing resin 42-2 is formed in advance in a mold for resin molding for provided the sealing resin 42-1 on the wiring board 41 by a transfer molding method. As a result of this, the sealing resin 42-1 and the reinforcing resin 42-2 can be provided in a lump (together) in a conventional resin sealing process.

Accordingly, since a special process for providing the reinforcing resin 42-2 is not necessary, it is possible to easily form the structure of this example by the same process as that of the conventional art.

In addition, as the sealing resin 42-1 and the reinforcing resin 42-2, for example, a thermosetting type epoxy resin containing a filler of approximately 70 through 90 Wt %, glass transition temperature of approximately 100 through 195° C., and a linear expansion coefficient of approximately $5\times10^{-6}$ through $20\times10^{-6}$ K$^{-1}$ or approximately $50\times10^{-6}$ through $100\times10^{-6}$ K$^{-1}$ can be used. Since such a thermosetting type epoxy resin has high filling capability, it is possible to easily form the reinforcing resin 42-2 on the wiring board 41 even if the configuration of the reinforcing resin 42-2 is complex.

Thus, in the semiconductor device 40 of the first example of the present invention, since the reinforcing resin 42-2 is provided along the perimeter of the external circumferential part of the sealing resin 42-1, the boundary part of the wiring board 41 and the sealing resin 42-1 is reinforced in a uniform manner along the perimeter of the external circumferential part of the sealing resin 42-1.

Therefore, stress that may be generated at the boundary part of the end part of sealing resin 42-1 and the wiring board 41 due to environmental temperature change or mechanical reasons is dispersed. Hence, generation of a crack in the wiring board 41 can be prevented and bad conductivity, namely pattern breakage, of the conductive layer 43A of the wiring board 11 is can be prevented.

In the meantime, although the reinforcing resin 42-2 has a triangle shaped cross section in the first example of the present invention, the present invention is not limited to this. The reinforcing resin 42-2 may have, for example, a rectangular shaped cross section or a cross section having a configuration including a curved part. In any case, it is possible to reinforce the boundary part of the end part of the sealing resin 42-1 and the wiring board 41 with the reinforcing resin 42-2.

In addition, although the thickness a (length in the vertical direction) of the reinforcing resin 42-2 and the length b in the horizontal direction of the reinforcing resin 42-2 are several tens μm in the first example of the present invention, the present invention is not limited to this.

A maximum thickness of the reinforcing resin 42-2 is equal to the thickness of the sealing resin 42-1. A maximum length in the horizontal direction of the reinforcing resin 42-2 is the distance from the end part of the sealing resin 42-1 to an end part of the wiring board 41. The greater the thickness a (length in the vertical direction) of the reinforcing resin 42-2 and the length b in the horizontal direction of the reinforcing resin 42-2, the more the effect of en embodiment of the present invention is achieved.

2. A Semiconductor Device of a Second Example of the Present Invention

Figure 5:
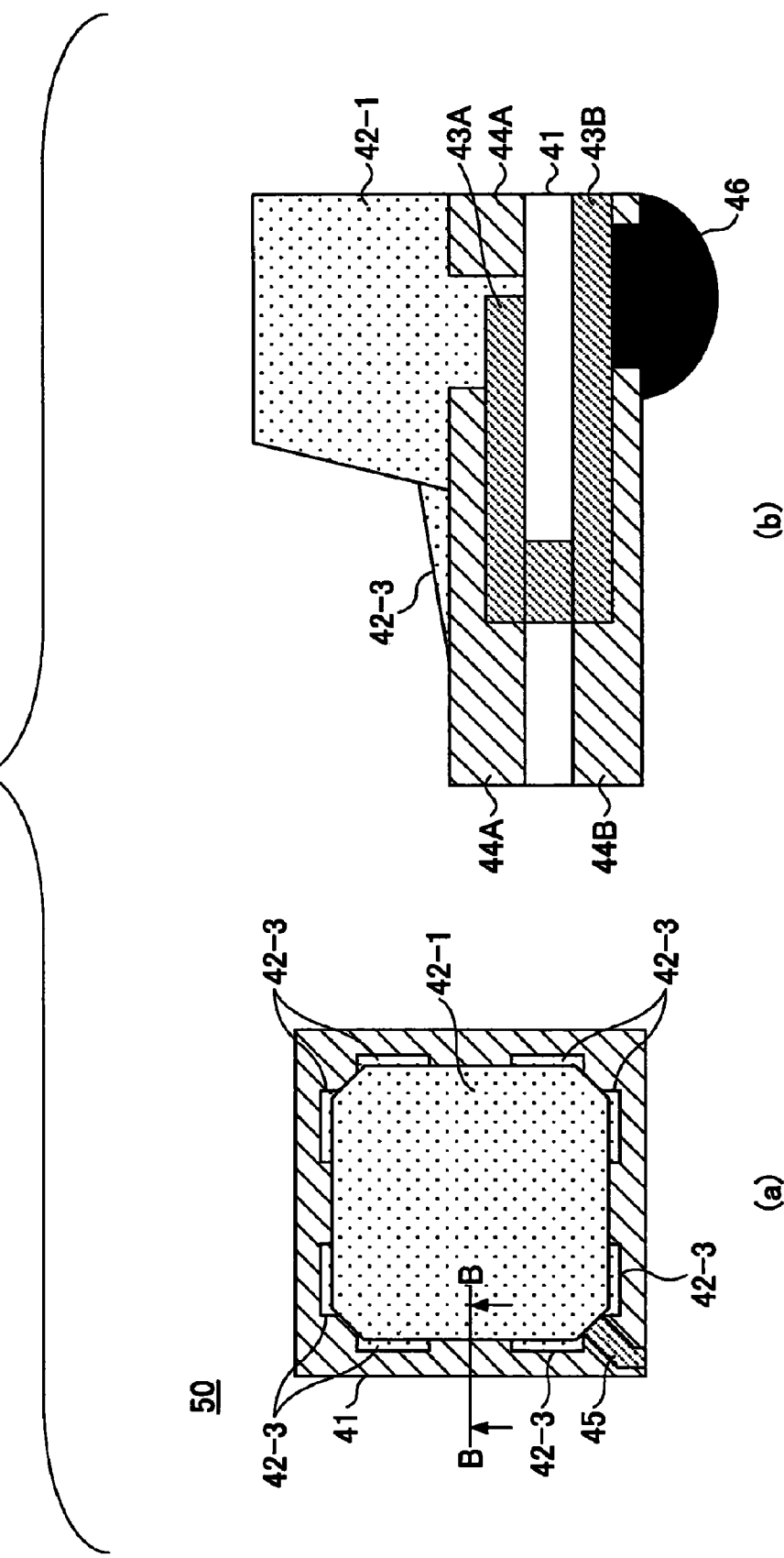
FIG. 5 is a view showing a structure of a semiconductor device of a second example of the present invention.

FIG. 5 is a view showing a structure of a semiconductor device of a second example of the present invention. More specifically, FIG. 5(a) is a plan view and FIG. 5(b) is a view taken along a line B-B in FIG. 5(a) and seen in a direction indicated by arrows. In FIG. 5, parts that are the same as the parts shown in FIG. 4 are given the same reference numerals, and explanation thereof is omitted.

In the above-discussed first example of the present invention shown in FIG. 4, the reinforcing resin 42-2 is provided along the perimeter of the external circumferential part of the sealing resin 42-1. However, the present invention is not limited to this. As shown in FIG. 5, the reinforcing resin may be selectively provided at only a part where reinforcing by the reinforcing resin is especially necessary.

More specifically, in a semiconductor device 50 of the second example of the present invention, reinforcing resin 42-3 made of a material the same as that of the sealing resin 42-1 is provided at only boundary parts of the sealing resin 42-1 in the vicinities of four corners of the sealing resin 42-1 and the wiring board 41.

Thus, a partially arranging structure where the reinforcing resin 42-3 is selectively provided at parts where reinforcing by the reinforcing resin is especially necessary is applied to the second example of the present invention. Therefore, while the boundary part of the end part of the sealing resin 42-1 and the wiring board 41 at a part especially weak against the stress is reinforced, the stress is eased by providing a part where the reinforcing resin 42-3 is not provided, that is a part where reinforcing by the reinforcing resin 42-3 is not made.

In the second example, as well as the first example, of the present invention, since the reinforcing resin 42-3 is made of the same material as that of the sealing resin 42-1, a special process for providing the reinforcing resin 42-3 is not necessary so that it is possible to easily form the structure of this example by the same process as that of the conventional art.

Furthermore, in the second example, as well as the first example, of the present invention, although the reinforcing resin 42-3 has a triangle shaped cross section as shown in FIG. 5(b), the present invention is not limited to this. The reinforcing resin 42-3 may have, for example, a rectangular shaped cross section or a cross section having a configuration including a curved part.

Furthermore, in the second example, as well as the first example, of the present invention, the thickness (length in the vertical direction) of the reinforcing resin 42-3 and the length in the horizontal direction of the reinforcing resin 42-3 may be several tens μm. A maximum thickness of the reinforcing resin 42-3 is equal to the thickness of the sealing resin 42-1. A maximum length in the horizontal direction of the reinforcing resin 42-3 is the distance from the end part of the sealing resin 42-1 to an end part of the wiring board 41.

3. A Semiconductor Device of a Third Example of the Present Invention

Figure 6:
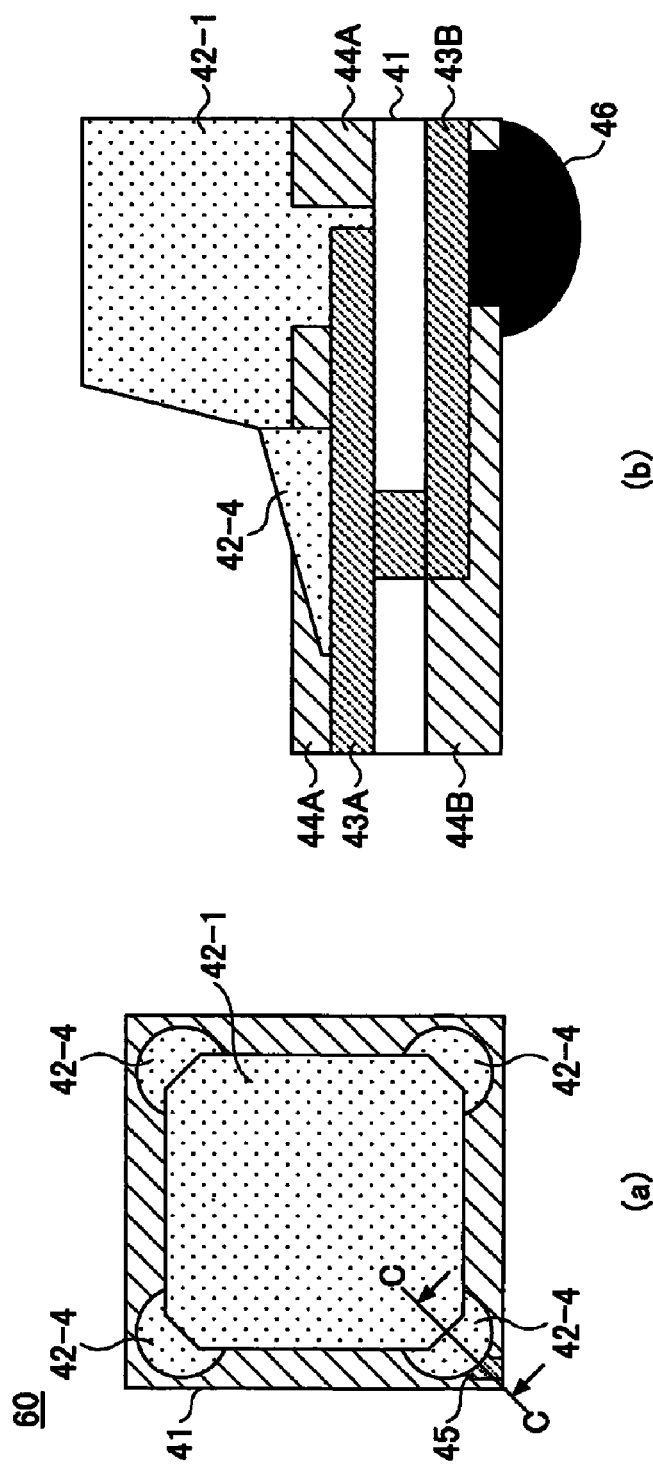
FIG. 6 is a view showing a structure of a semiconductor device of a third example of the present invention.

FIG. 6 is a view showing a structure of a semiconductor device of a third example of the present invention. More specifically, FIG. 6(a) is a plan view and FIG. 6(b) is a view taken along a line C-C in FIG. 6(a) and seen in a direction indicated by arrows. In FIG. 6, parts that are the same as the parts shown in FIG. 5 are given the same reference numerals, and explanation thereof is omitted.

In the third example of the present invention, as shown in FIG. 6, four corners of the sealing resin 42-1 are selected as parts where reinforcing by the reinforcing resin is especially necessary and reinforcing resin is provided at the four corners of the sealing resin 42-1.

More specifically, in a semiconductor device 60 of the third example of the present invention, reinforcing resin 42-4 made of a material the same as that of the sealing resin 42-1 is provided at only four corners of the sealing resin 42-1.

Thus, a corners arranging structure where the reinforcing resin 42-4 is selectively provided at four corners of the sealing resin 42-1 where reinforcing by the reinforcing resin is especially necessary because the four corners are weak against the stress, is applied to the third example of the present invention. Therefore, while the boundary part of the end part of the sealing resin 42-1 and the wiring board 41 at the four corners is reinforced, the stress is eased by providing a part where the reinforcing resin 42-4 is not provided, that is four sides of the sealing resin 42-1 where reinforcing by the reinforcing resin 42-4 is not made.

In the third example, as well as the first example, of the present invention, since the reinforcing resin 42-4 is made of the same material as that of the sealing resin 42-1, a special process for providing the reinforcing resin 42-4 is not necessary so that it is possible to easily form the structure of this example by the same process as that of the conventional art.

Furthermore, in the third example, as well as the first example, of the present invention, although the reinforcing resin 42-4 has a triangle shaped cross section as shown in FIG. 6(b), the present invention is not limited to this. The reinforcing resin 42-4 may have, for example, a rectangular shaped cross section or cross section having a configuration including a curved part.

Furthermore, in the third example, as well as the first example, of the present invention, the thickness (length in the vertical direction) of the reinforcing resin 42-4 and the length in the horizontal direction of the reinforcing resin 42-4 may be several tens μm. A maximum thickness of the reinforcing resin 42-4 is equal to the thickness of the sealing resin 42-1. A maximum length in the horizontal direction of the reinforcing resin 42-4 is the distance from the end part of the sealing resin 42-1 to an end part of the wiring board 41.

4. A Semiconductor Device of a Fourth Example of the Present Invention

Figure 7:
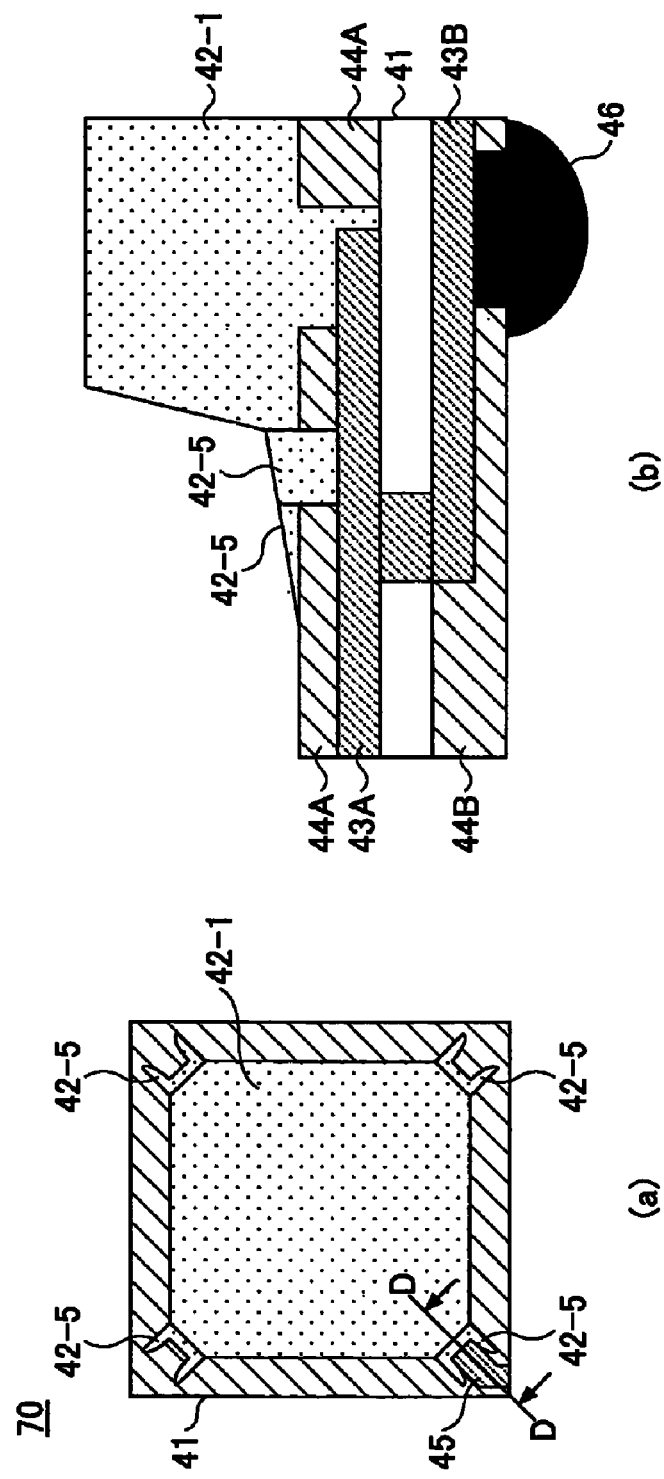
FIG. 7 is a view showing a structure of a semiconductor device of a fourth example of the present invention.

FIG. 7 is a view showing a structure of a semiconductor device of a fourth example of the present invention. More specifically, FIG. 7(a) is a plan view and FIG. 7(b) is a view taken along a line D-D in FIG. 7(a) and seen in a direction indicated by arrows. In FIG. 7, parts that are the same as the parts shown in FIG. 6 are given the same reference numerals, and explanation thereof is omitted.

In the third example of the present invention shown in FIG. 6, the reinforcing resin 42-4 made of the same material as that of the sealing resin 42-1 is provided at the four corners of the sealing resin 42-1. More specifically, the reinforcing resin 42-4 has an arc shaped plan configuration in a plan view and partially covers the wiring pattern 45 formed on an upper surface of the wiring board 41.

However, the present invention is not limited to this example.

In a semiconductor device 70 of the fourth example of the present invention, four corners of the sealing resin 42-1 are selected as parts where reinforcing by the reinforcing resin is especially necessary and reinforcing resin 42-5 having a plan view configuration whose substantially center part is concave is provided at the four corners of the sealing resin 42-1.

Since the four corners of the sealing resin 42-1 are parts especially weak against stress, the reinforcing resin 42-5 is selectively provided at only the four corners of the sealing resin 42-1.

On the other hand, since the reinforcing resin 42-5 has the plan view configuration where the substantially center part is concave, the amount covering the wiring pattern 45 in this example is smaller than that in the third example. Accordingly, it is not necessary to change the arrangement of the wiring pattern 45 in order to correspond to the configuration of the reinforcing resin 42-5 provided on the wiring board 41.

In addition, the stress is eased by providing a part where the reinforcing resin 42-5 is not provided, that is four sides of the sealing resin 42-1 where reinforcing by the reinforcing resin 42-5 is not made.

In the fourth example, as well as the first example, of the present invention, since the reinforcing resin 42-5 is made of the same material as that of the sealing resin 42-1, a special process for providing the reinforcing resin 42-5 is not necessary so that it is possible to easily form the structure of this example by the same process as that of the conventional art.

Furthermore, in the fourth example, as well as the first example, of the present invention, although the reinforcing resin 42-5 has a triangle shaped cross section as shown in FIG. 7(b), the present invention is not limited to this. The reinforcing resin 42-5 may have, for example, a cross section having a configuration including a curved part.

Furthermore, in the fourth example, as well as the third example shown in FIG. 6, of the present invention, the thickness (length in the vertical direction) of the reinforcing resin 42-5 and the length in the horizontal direction of the reinforcing resin 42-5 may be several tens μm. A maximum thickness of the reinforcing resin 42-5 is equal to the thickness of the sealing resin 42-1. A maximum length in the horizontal direction of the reinforcing resin 42-5 is the distance from the end part of the sealing resin 42-1 to an end part of the wiring board 41.

In the first through fourth examples, a material of the sealing resin 42-1 is the same as those of the reinforcing resins 42-2 through 42-5. Therefore, a configuration corresponding to an external configuration of the reinforcing resins 42-2 through 42-5 is formed in advance in a mold for resin molding for providing the sealing resin 42-1 on the wiring board 41 by a transfer molding method. As a result of this, the sealing resin 42-1 and one of the reinforcing resins 42-2 through 42-5 can be provided in a lump in a conventional resin sealing process. Therefore, since a special process for providing the reinforcing resins 42-2 through 42-5 is not necessary, it is possible to easily form the structure of the first through fourth examples by the same process as that of the conventional art.

However, the present invention is not limited to a case where the reinforcing resins 42-2 through 42-5 are formed in a lump with the sealing resin 42-1. The present invention may be applied a case where resin made of a material different from that of the sealing resin 42-1 is used as the reinforcing resins 42-2 through 42-5.

In the following explanation, the case where resin made of a material different from that of the sealing resin 42-1 is used as the reinforcing resins 42-2 through 42-5 is discussed.

5. A Semiconductor Device of a Fifth Example of the Present Invention

Figure 8:
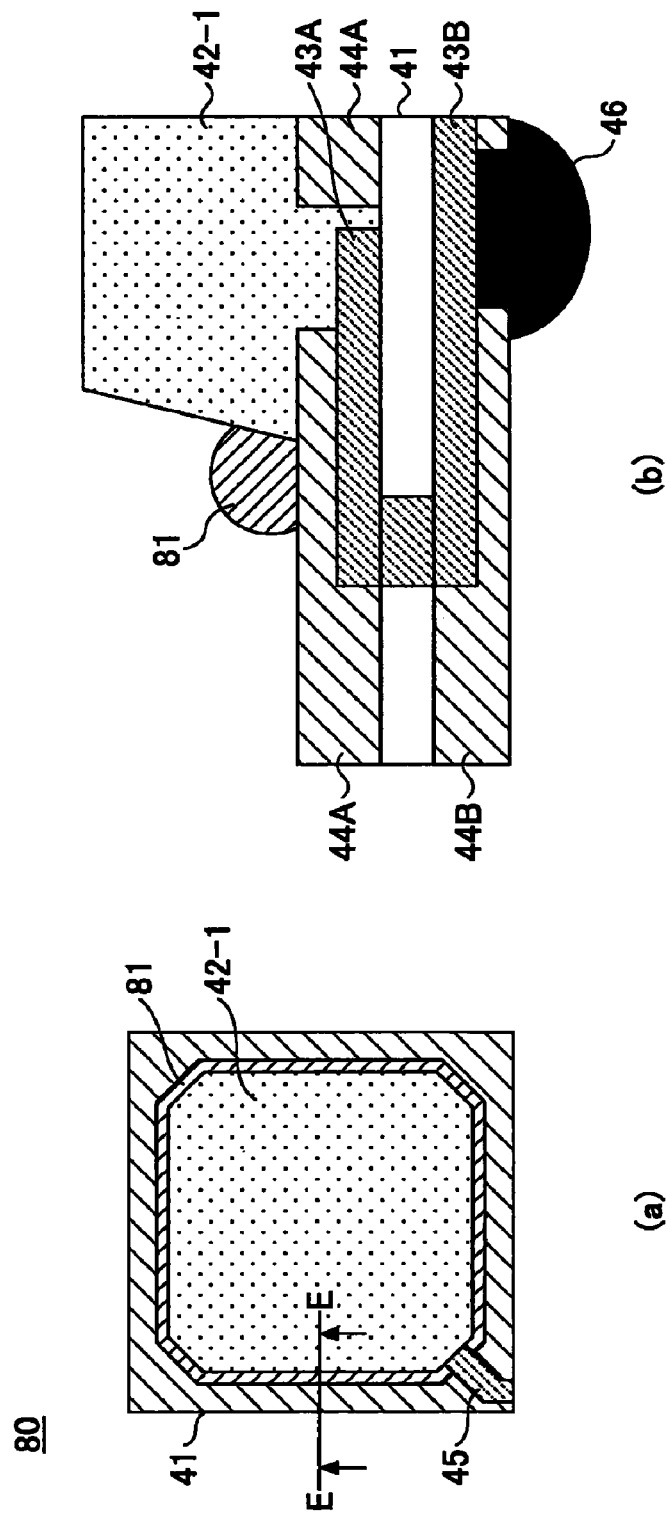
FIG. 8 is a view showing a structure of a semiconductor device of a fifth example of the present invention.

FIG. 8 is a view showing a structure of a semiconductor device of a fifth example of the present invention. More specifically, FIG. 8(a) is a plan view and FIG. 8(b) is a view taken along a line E-E in FIG. 8(a) and seen in a direction indicated by arrows. In FIG. 8, parts that are the same as the parts shown in FIG. 4 are given the same reference numerals, and explanation thereof is omitted.

In a semiconductor device 80 of the fifth example, as well as the semiconductor device 40 shown in FIG. 4 of the first example, of the present invention, the reinforcing resin 81 is provided along the perimeter of the external circumferential part of the sealing resin 42-1. More specifically, the reinforcing resin 81 is provided along the perimeter of the boundary part of the wiring board 41 and the sealing resin 42-1 so that the boundary part is reinforced. In addition, a cross section of the reinforcing resin has an arc shaped part.

In the fifth example of the present invention, the reinforcing resin 81 is made of a material different from that of the sealing resin 42-1.

In addition, as the sealing resin 42-1, for example, a thermosetting type epoxy resin containing a filler of approximately 70 through 90 Wt %, glass transition temperature of approximately 100 through 195° C., and a linear expansion coefficient of approximately $5\times10^{-6}$ through $20\times10^{-6}$ $K^{-1}$ or approximately $50\times10^{-6}$ through $100\times10^{-6}$ $K^{-1}$ can be used. As the reinforcing resin 81, for example, a thermosetting type liquid state epoxy resin having a viscosity of approximately 1000 through 15000 mPa·s, a filler of approximately 0 through 80 Wt %, glass transition temperature of approximately 100 through 150° C., and a linear expansion coefficient of approximately $30\times10^{-6}$ through $40\times10^{-6}$ $K^{-1}$ or approximately $100\times10^{-6}$ through $120\times10^{-6}$ $K^{-1}$ can be used.

Although details are discussed below, the structure of the fifth example of the present invention can be formed by providing the sealing resin 42-1 on the wiring board 41 and then providing the reinforcing resin 81 on the wiring board 41 with a method such as a potting method.

The thermosetting type liquid state epoxy resin having the above-mentioned properties and used as the reinforcing resin 81 can be formed in various configurations by controlling the velocity. Hence, in order to fit in a desirable design, after the sealing resin 42-1 is provided, the reinforcing resin 81 can be provided by controlling the configuration and amount of the reinforcing resin 81.

Thus, in the semiconductor device 80 of the fifth example of the present invention, the reinforcing resin 81 made of a material different from that of the sealing resin 42-1 is provided along the perimeter of the external circumference part of the sealing resin 42-1. Hence, the boundary part of the wiring board 41 and the sealing resin 42-1 is reinforced in a uniform manner along the perimeter of the external circumferential part of the sealing resin 42-1.

Therefore, stress that may be generated at the boundary part of the end part of sealing resin 42-1 and the wiring board 41 due to environmental temperature change or mechanical reasons is dispersed. Hence, generation of a crack in the wiring board 41 can be prevented and bad conductivity, namely pattern breakage, of the conductive layer 43A of the wiring board 11 can be prevented.

Especially, in the fifth example of the present invention, since the reinforcing resin 81 is made of a material different from that of the sealing resin 42-1, in order to fit in a desirable design, after the sealing resin 42-1 is provided, the reinforcing resin 81 can be provided by controlling the configuration and amount of the reinforcing resin 81.

Furthermore, in the fifth example of the present invention, although the reinforcing resin 81 has a arc shaped cross section, the present invention is not limited to this. The reinforcing resin 81 may have, for example, a rectangular shaped cross section or triangle shaped configuration like the reinforcing resin 42-2 shown in FIG. 4.

In addition, in the fifth example of the present invention, the thickness (length in the vertical direction) of the reinforcing resin 81 and the length in the horizontal direction of the reinforcing resin 81 may be several tens μm. A maximum thickness of the reinforcing resin 81 is equal to the thickness of the sealing resin 42-1. A maximum length in the horizontal direction of the reinforcing resin 81 is the distance from the end part of the sealing resin 42-1 to an end part of the wiring board 41.

In any case, it is possible to reinforce the boundary part of the end part of the sealing resin 42-1 and the wiring board 41 by the reinforcing resin 81.

6. A Semiconductor Device of a Sixth Example of the Present Invention

Figure 9:
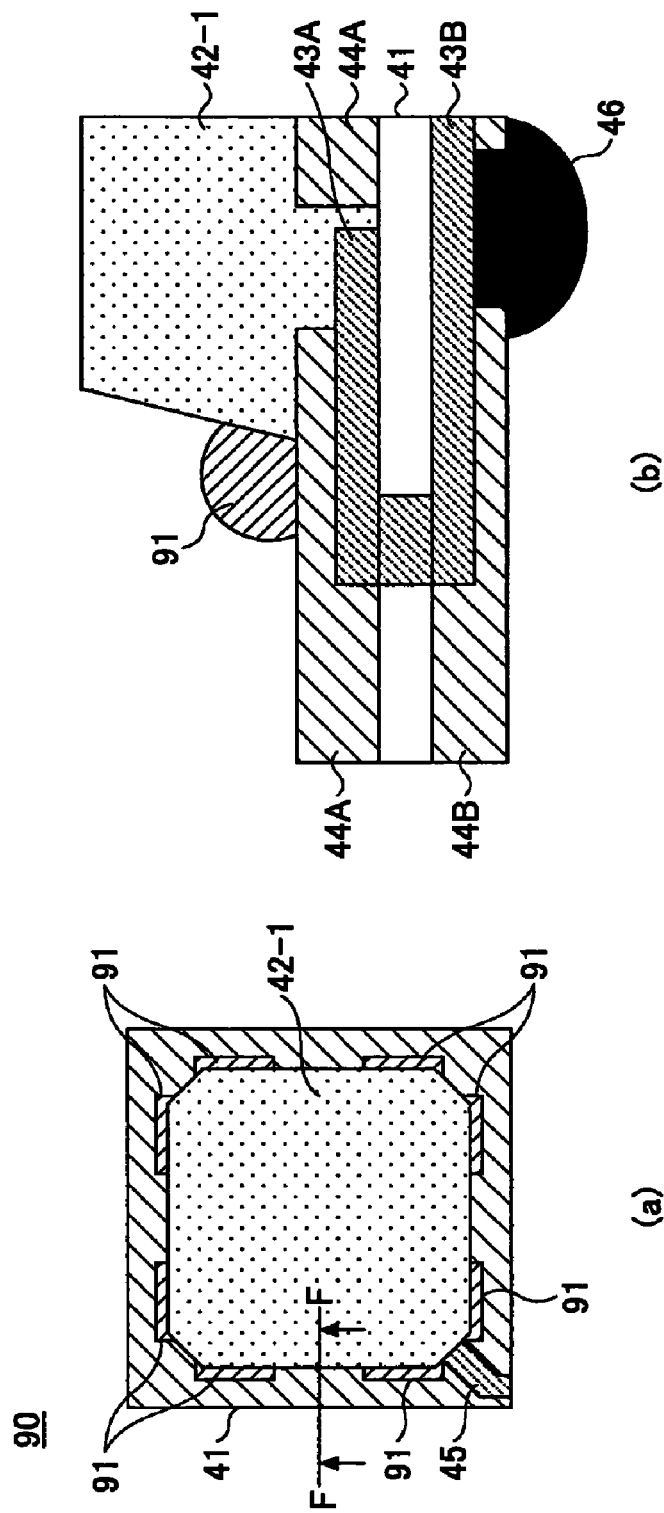
FIG. 9 is a view showing a structure of a semiconductor device of a sixth example of the present invention.

FIG. 9 is a view showing a structure of a semiconductor device of a sixth example of the present invention. More specifically, FIG. 9(a) is a plan view and FIG. 9(b) is a view taken along a line F-F in FIG. 9(a) and seen in a direction indicated by arrows. In FIG. 9, parts that are the same as the parts shown in FIG. 5 are given the same reference numerals, and explanation thereof is omitted.

In the semiconductor device 80 of the fifth example of the present invention, the reinforcing resin 81 made of a material different from that of the sealing resin 42-1 is provided along the perimeter of the external circumferential part of the sealing resin 42-1. However, the present invention is not limited to this.

In a semiconductor device 90 of the sixth example, as well as the semiconductor device 50 shown in FIG. 5 of the second example, of the present invention, the reinforcing resin is selectively provided at only a part where reinforcing by the reinforcing resin is especially necessary.

More specifically, in a semiconductor device 90 of the sixth example of the present invention, reinforcing resin 91 made of a material different from that of the sealing resin 42-1 is provided at only boundary parts of the sealing resin 42-1 in the vicinities of four corners of the sealing resin 42-1 and the wiring board 41.

Thus, a partially arranging structure where the reinforcing resin 91 is selectively provided at parts where reinforcing by the reinforcing resin 91 is especially necessary is applied to the sixth example of the present invention. Therefore, while the boundary part of the end part of the sealing resin 42-1 and the wiring board 41 at a part especially weak against the stress is reinforced, the stress is eased by providing a part where the reinforcing resin 91 is not provided, that is a part where reinforcing by the reinforcing resin 91 is not made.

In addition, since the reinforcing resin 91 is made of a material different from that of the sealing resin 42-1, in order to fit in a desirable design, after the sealing resin 42-1 is provided, the reinforcing resin 91 can be provided by controlling the configuration and amount of the reinforcing resin 91.

Especially, in the sixth example of the present invention, since the reinforcing resin 91 is made of a material different from that of the sealing resin 42-1, in order to fit in a desirable design, after the sealing resin 42-1 is provided, the reinforcing resin 91 can be provided by controlling the configuration and amount of the reinforcing resin 91.8

Furthermore, in the sixth example of the present invention, although the reinforcing resin 91 has an arc shaped cross section, the present invention is not limited to this. The reinforcing resin 91 may have, for example, a rectangular shaped cross section or triangle shaped configuration like the reinforcing resin 42-3 shown in FIG. 5.

In addition, in the sixth example of the present invention, the thickness (length in the vertical direction) of the reinforcing resin 91 and the length in the horizontal direction of the reinforcing resin 91 may be several tens μm. A maximum thickness of the reinforcing resin 91 is equal to the thickness of the sealing resin 42-1. A maximum length in the horizontal direction of the reinforcing resin 91 is the distance from the end part of the sealing resin 42-1 to an end part of the wiring board 41.

In any case, it is possible to reinforce the boundary part of the end part of the sealing resin 42-1 and the wiring board 41 by the reinforcing resin 91.

Meanwhile, in the structure shown in FIG. 6 or FIG. 7, a material different from the material of the sealing resin 42-1 can be used as a material of the reinforcing resin 42-4 or 42-5.

[Manufacturing Method of Semiconductor Device]

Figure 10:
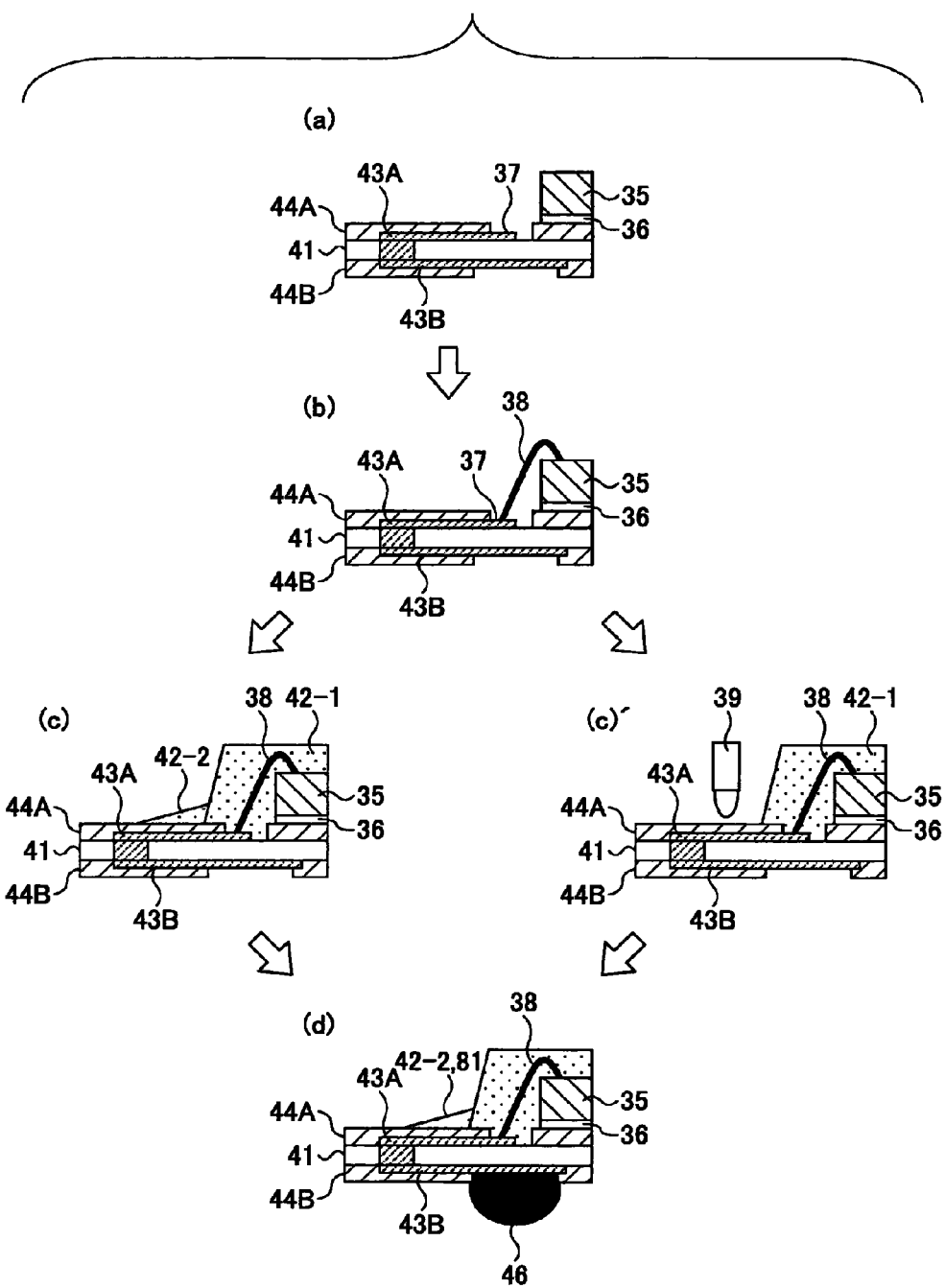
FIG. 10 is a view for explaining a manufacturing method of the semiconductor device of the present invention.

Next, manufacturing methods of the above-discussed semiconductor devices are discussed with reference to FIG. 10. Here, FIG. 10 is a view for explaining the manufacturing method of the semiconductor device of the present invention. FIG. 10(a) through FIG. 10(d) shows only the end part of the above-discussed wiring board 41 and its vicinity.

As shown in FIG. 10(a), first, the semiconductor element 35 is adhered on the wiring board 41 via the die bonding member 36 such as a die bonding film. Then, the die bonding member 36 is cured so that the semiconductor element 35 is fixed to the wiring board 41.

Next, as shown in FIG. 10(b), outside connection terminals of the semiconductor element 35 and connection terminals 37 of the wiring board 41 are connected to each other by bonding wires 38.

After that, as shown in FIG. 10(c) and FIG. 10(c)', the semiconductor element 35, the bonding wires 38, and others are sealed by a transfer molding method using the sealing resin 42-1.

In order to form the structure having one of the reinforcing resins 42-2 through 42-5 made of the material the same as the material of the sealing resin 42-1 like the first through fourth example of the semiconductor device of the present invention shown in FIG. 4 through FIG. 7, a configuration corresponding an external configuration of one of the reinforcing resins 42-2 through 42-5 is formed in advance in a mold for resin molding for provided the sealing resin 42-1 on the wiring board 41 by a transfer molding method. As a result of this, the sealing resin 42-1 and one of the reinforcing resin 42-2 through 42-5 are provided in a lump in the resin sealing process shown in FIG. 10(c).

Accordingly, since a special process for providing one of the reinforcing resins 42-2 through 42-5 is not necessary, it is possible to easily provide one of the reinforcing resins 42-2 through 42-5 on the wiring board 41 by the same process as that of the conventional art.

Although FIG. 10(c) shows where the reinforcing resin 42-2 is provided the same as shown in FIG. 4 depending on the configuration formed in the mold, the reinforcing resin 42-3 may be provided in the vicinities of the four corners of the sealing resin 42-1 as shown in FIG. 5; the reinforcing resin 42-4 may be provided in the vicinities of the four corners of the sealing resin 42-1 as shown in FIG. 6; and the reinforcing resin 42-5 having plan configurations whose center parts are concave may be provided in the vicinities of the four corners of the sealing resin 42-1 as shown in FIG. 7. As discussed above, there is no limitation to the cross section of the reinforcing resins 42-2 through 42-5.

In any case, it is possible to reinforce the boundary part of the end part of the sealing resin 42-1 and the wiring board 41 by the reinforcing resins 42-2 through 42-5.

On the other hand, in order to form the structure having one of the reinforcing resins 81 and 91 made of a material different from the material of the sealing resin 41-1 like the fifth and sixth examples of the semiconductor device of the present invention shown in FIG. 4 through FIG. 7, as shown in FIG. 10(c)', after the sealing resin 42-1 is provided on and fixed to the wiring board 41, liquid state reinforcing resin 81 or 91 (See FIG. 8 or FIG. 9) is caused to flow by using a potting nozzle 39 so that the reinforcing resin 81 or 91 is additionally provided on the wiring board 41.

In this case, in order to fit in a desirable design, after the sealing resin 42-1 is provided, the reinforcing resin can be provided by controlling the configuration and amount of the reinforcing resin provided on the wiring board 41.

As a result of this, as shown in FIG. 8, the reinforcing resin 81 comes in contact with a part of the external circumference of the sealing resin 42-1 and is provided along the perimeter of the external circumference of the sealing resin 42-1. In addition, as shown in FIG. 9, the reinforcing resin 91 is provided in only the vicinities of the four corners of the sealing resin 42-1.

In any case, it is possible to reinforce the boundary part of the end part of the sealing resin 42-1 and the wiring board 41 by the reinforcing resin 81 or 91.

After the process shown in FIG. 10(c) or FIG. 10(c)', as shown in FIG. 10(d), plural outside connection terminals (bumps) 46 such as spherical shape electrode terminals whose main ingredient is solder are arranged in a grid state on a rear surface of the wiring board 41-1 so that the semiconductor device is formed.

In a case where a large scale wiring board is applied as the wiring board 41-1 and plural semiconductor elements 35 are formed on the wiring board 41-1, after the outside connection terminals 46 are provided, parts between the semiconductor elements 35 of the wiring board 41-1 are cut and separated by using a dicing blade or the like so that individual semiconductor devices are completed.

The present invention is not limited to these embodiments, but variations and modifications may be made without departing from the scope of the present invention.

This patent application is based on Japanese Priority Patent Application No. 2006-221953 filed on Aug. 16, 2006, the entire contents of which are hereby incorporated by reference.

What is claimed is:

1. A semiconductor device, comprising:
   a semiconductor element;
   a wiring board having an upper surface where the semiconductor element is provided and a lower surface facing the upper surface, the lower surface having an outside connection terminal is provided, the wiring board further including a conductive layer, the conductive layer being connected to the semiconductor element at the upper surface and connected to the outside connection terminal at the lower surface, the conductive layer being covered with a resist;

sealing resin formed over the conductive layer and the semiconductor element; and reinforcing resin provided at least at a part of a boundary part between an external side surface of the sealing resin and the resist, the reinforcing resin being provided along a perimeter of the external side surface of the sealing resin but not extending over an upper surface of the sealing resin, wherein the sealing resin and the reinforcing resin are made of thermosetting epoxy resins containing a filler of 70 Wt % through 90 Wt %, and having a glass transition temperature of 100° C. through 195° C. and a linear expansion coefficient of $5 \times 10^{-6}$ K$^{-1}$ through $20 \times 10^{-6}$ K$^{-1}$ or $50 \times 10^{-6}$ through $100 \times 10^{-6}$ K$^{-1}$.

2. The semiconductor device as claimed in claim 1, wherein the reinforcing resin is provided along a perimeter of the part of the boundary part.

3. The semiconductor device as claimed in claim 1, wherein the reinforcing resin is provided at the boundary part in a vicinity of a corner part of the sealing resin.

4. The semiconductor device as claimed in claim 1, wherein the reinforcing resin is provided at the boundary part at a corner part of the sealing resin.

5. The semiconductor device as claimed in claim 1, wherein the reinforcing resin has a configuration where a concave part is formed in plan view.

6. The semiconductor device as claimed in claim 1, wherein length in a vertical direction of the reinforcing resin is equal to or greater than several tens µm and equal to or less than thickness of the sealing resin.

7. The semiconductor device as claimed in claim 1, wherein length in a horizontal direction of the reinforcing resin is equal to or greater than several tens µm and equal to or less than a distance from an end part of the sealing resin to an end part of the resist.

8. The semiconductor device as claimed in claim 1, wherein the reinforcing resin is made of a material the same as a material of the sealing resin.

9. The semiconductor device as claimed in claim 1, wherein the reinforcing resin is made of a material different from a material of the sealing resin.

10. A manufacturing method of a semiconductor device having a structure where a semiconductor element provided over an upper surface of a wiring board is sealed by sealing resin, comprising:

providing reinforcing resin made of a material the same as the material of the sealing resin at least at a part of a boundary part between an external side surface of the sealing resin and a resist covering a conductive layer of the wiring board, the reinforcing resin being provided along a perimeter of the external side surface of the sealing resin but not extending over an upper surface of the sealing resin, the external side surface being exposed to an outside of the semiconductor device, the conductive layer being connected to the semiconductor element at the upper surface and connected to an outside connection terminal provided at a lower surface of the wiring board, the lower surface facing the upper surface, and in a lump with the sealing resin when the semiconductor element is sealed, the sealing resin and the reinforcing resin are made of thermosetting epoxy resins containing a filler of 70 Wt % through 90 Wt %, and having a glass transition temperature of 100° C. through 195° C. and a linear expansion coefficient of $5 \times 10^{-6}$ K$^{-1}$ through $20 \times 10^{-6}$ K$^{-1}$ or $50 \times 10^{-6}$ K$^{-1}$ through $100 \times 10^{-6}$ K$^{-1}$.

11. The manufacturing method of the semiconductor device as claimed in claim 10, wherein a configuration corresponding to an external configuration of the reinforcing resin provided over the wiring board is formed in advance in a mold used for sealing the semiconductor element by the sealing resin.

12. A manufacturing method of a semiconductor device having a structure where a semiconductor element provided over an upper surface of a wiring board is sealed by sealing resin, comprising:

providing reinforcing resin made of a material different from a material of the sealing resin at least at a part of a boundary part between an external side surface of the sealing resin and a resist covering a conductive layer of the wiring board, after the sealing resin is provided over the wiring board and is made solid, the reinforcing resin being provided along a perimeter of the external side surface of the sealing resin but not extending over an upper surface of the sealing resin, the external side surface being exposed to an outside of the semiconductor device, the conductive layer being connected to the semiconductor element at the upper surface and connected to an outside connection terminal provided at a lower surface of the wiring board, the lower surface facing the upper surface, the sealing resin and the reinforcing resin are made of thermosetting epoxy resins containing a filler of 70 Wt % through 90 Wt %, and having a glass transition temperature of 100° C. through 195° C. and a linear expansion coefficient of $5 \times 10^{-6}$ K$^{-1}$ through $20 \times 10^{-6}$ K$^{-1}$ or $50 \times 10^{-6}$ K$^{-1}$ through $100 \times 10^{-6}$ K$^{-1}$.

13. The manufacturing method of the semiconductor device as claimed in claim 12, wherein the reinforcing resin is provided over the wiring board by a potting method.

* * * * *